United States Patent [19]

Carbonini

[11] Patent Number: 5,237,283
[45] Date of Patent: Aug. 17, 1993

[54] DEVICE FOR MEASURING ELECTROMAGNETIC INTERFERENCE

[75] Inventor: Lorenzo Carbonini, Camogli, Italy
[73] Assignee: Amplisilence S.r.l., Turin, Italy
[21] Appl. No.: 896,596
[22] Filed: Jun. 10, 1992
[30] Foreign Application Priority Data
Jun. 11, 1991 [EP] European Pat. Off. .......... 91830256
[51] Int. Cl.⁵ .......................................... G01R 29/08
[52] U.S. Cl. .................... 324/627; 324/628; 324/632; 333/22 R; 333/243; 343/703
[58] Field of Search ................... 333/22 R, 243, 81 A; 343/703; 342/1, 4; 324/627, 628, 632

[56] References Cited

U.S. PATENT DOCUMENTS 3,290,598 12/1966 Thomas .
4,837,581 6/1969 Hansen et al. ...................... 343/703
5,051,747 9/1991 Harshman et al. ...................... 342/1
5,055,806 10/1991 Hansen et al. ...................... 333/22 R

FOREIGN PATENT DOCUMENTS 0205747 12/1986 European Pat. Off. .
0246544 11/1987 European Pat. Off. .

OTHER PUBLICATIONS

AP-S Int'l Symposium, vol. I, Jun. 26, 1989, San Jose, pp. 336-338; Liepa et al: "Analysis and Design of 4-Wire Antenna For Anechoic Chamber Exitation".

Primary Examiner—Paul Gensler
Attorney, Agent, or Firm—Sughrue, Mion, Zinn, Macpeak & Seas

[57] ABSTRACT

The device is of the type comprising a closed test cell the periphery of which is defined by an outer conductor of a TEM waveguide constituted by a tubular casing. An inner conductor of the waveguide extends within the cell. The casing has at least one intermediate portion of uniform rectangular cross-section, in which there is a test region for accommodating an object under test. At least in the intermediate portion, the inner conductor has a substantially arcuate transverse profile, the concave side of which faces the object under test. The inner conductor is preferably constituted by an array of transversely spaced-apart parallel wires arranged so that the array has the said arcuate profile.

8 Claims, 3 Drawing Sheets

DEVICE FOR MEASURING ELECTROMAGNETIC INTERFERENCE

BACKGROUND OF THE INVENTION

The present invention relates to a device for measuring electromagnetic interference (EMI), of the type comprising a closed test cell the periphery of which is defined by an outer conductor of a waveguide constituted by a tubular casing having rectangular cross-sections and delimited at one end by a supply cusp and at the other end by a transverse wall which is absorbent as regards high frequencies and is associated with resistors for low-frequency dissipation, and an inner conductor of the waveguide extending within the cell between the supply cusp and the resistors.

A device of this type is known from U.S. Pat. No. 4,837,581 amongst others.

Other similar devices are known, for example, from the following publications: IEEE Transactions on Electromagnetic Compatibility, Vol. EMC-16, No. 4, November 1974, pp. 189–195, Pollard, N., "A Broad-Band Electromagnetic Environments Simulator (EMES)", IEEE Symposium on EMC, Seattle, August 1977, IEEE 1978 International Symposium on EMC-Symp. Rec. (Atlanta, Ga.), June 1978, pp 204–208.

In all these known devices, the inner conductor is in the form of a flat plate enclosed by an outer conductor of rectangular or square cross-section.

FIG. 1 is a schematic cross-section of a device for measuring electromagnetic interference according to the prior art. The section is taken in a region which accommodates the object under test.

A tubular casing which constitutes the outer conductor of a TEM waveguide is indicated 10 and the inner conductor of the guide, which is in the form of a flat plate, is indicated 12.

One of the requirements for a measuring device of the type in question is that the intensity of the electromagnetic field in the test region must be substantially uniform.

FIG. 1 shows the lines of equal intensity of the electromagnetic field with respect to a reference intensity, indicated 0 dB.

The reference line 0 dB is located between corresponding lines with relative intensities of +1 dB and −1 dB. The intensity of the field may be considered sufficiently uniform for the purposes of electromagnetic interference tests if the object under test is in a region, indicated Z in FIG. 1, between +1 dB and −1 dB.

In many applications it would be desirable for the region Z to be much larger for given dimensions and proportions of the two conductors 10 and 12.

SUMMARY OF THE INVENTION

A first problem which the invention aims to solve is that of providing a device for measuring electromagnetic interference of the type in question, in which the intensity of the electromagnetic field is substantially uniform in a test region which is much larger both in cross-section and longitudinally of the test cell.

According to the invention, this object is achieved by means of a device of the type defined above, characterized in that the tubular casing has at least one intermediate portion of uniform rectangular cross-section including a test region for accommodating an object under test between the inner conductor and one of the peripheral walls of the outer conductor, called the base wall, and in that, at least in the intermediate portion, the inner conductor has a substantially arcuate transverse profile, the concave side of which faces the base wall.

In the present description and in the claims, the adjective "rectangular" includes the meaning "square", the term "base wall" refers to any peripheral wall of the tubular casing constituting the outer conductor regardless of the spatial arrangement of that wall, and the adjective "arcuate", describing a transverse profile, indicates either a curve or a broken line approximating to a curve.

FIG. 2 is similar to FIG. 1 and corresponds to a preferred embodiment of the invention which will be described below. Once again, the tubular casing or outer conductor of the waveguide (TEM) is indicated 10 and the inner conductor of the guide is indicated 12.

As can be seen from FIG. 2, if the dimensions and proportions are the same as those of FIG. 1, the reference level 0 dB is at more or less the same height but the useful test region, which is again indicated Z, is considerably larger than that of FIG. 1, by virtue of the arcuate arrangement of the inner conductor 12.

The field diagram of FIG. 2 relates to an embodiment in which the inner conductor 12 is constituted by an array of parallel wires 14 but, if the inner conductor 12 is constituted by a correspondingly-shaped plate with an arcuate profile, the distribution of the electromagnetic field in a cross-section of the cell is even better due to the presence of a slightly larger region Z.

The substantially arcuate inner conductor extends throughout the axial length of the intermediate portion containing the test region. This ensures that the field diagram of FIG. 2 is substantially uniform throughout that region which can therefore accommodate test objects not only of greatly differing widths and heights, but also of greatly differing lengths, whilst ensuring the repeatability of the tests.

The inner conductor is preferably constituted by an array of transversely spaced-apart, parallel wires, such as those indicated 14 in FIG. 2, extending from the cusp to the resistors and, at least in the intermediate portion, arranged so that the array has the said arcuate transverse profile.

According to the invention, the use of wires instead of a plate has two advantages: on the one hand, it is easier to produce an arcuate transverse profile by means of wires than to shape a metal plate or strip to that profile; on the other hand, it has been found that, for a cell of given dimensions and proportions, the use of parallel wires instead of a plate as the inner conductor considerably reduces the impedance mismatch due to the presence of a metal object under test, such as a motor vehicle. With an inner conductor constituted by parallel wires, there are consequently fewer reflections from the object under test than with an inner conductor in the form of a plate or strip. From another point of view, a cell, again with the same dimensions and proportions and with an inner conductor in the form of parallel wires, can accommodate larger objects than the prior art whilst keeping the reflections to reasonable levels.

The Applicant has already tested the use of an array of wires as an inner conductor in a test device of the type in question. In this embodiment, however, the wires were arranged in a plane corresponding to that of a flat plate and did not give satisfactory results from the point of view of the distribution of the electromagnetic field.

BRIEF DESCRIPTION OF THE DRAWINGS

Further characteristics and advantages of the invention will become clear from a reading of the detailed description which follows, with reference to the appended drawings, which show a currently preferred embodiment of the invention, and in which.

DETAILED DESCRIPTION OF THE INVENTION

Figure 1:
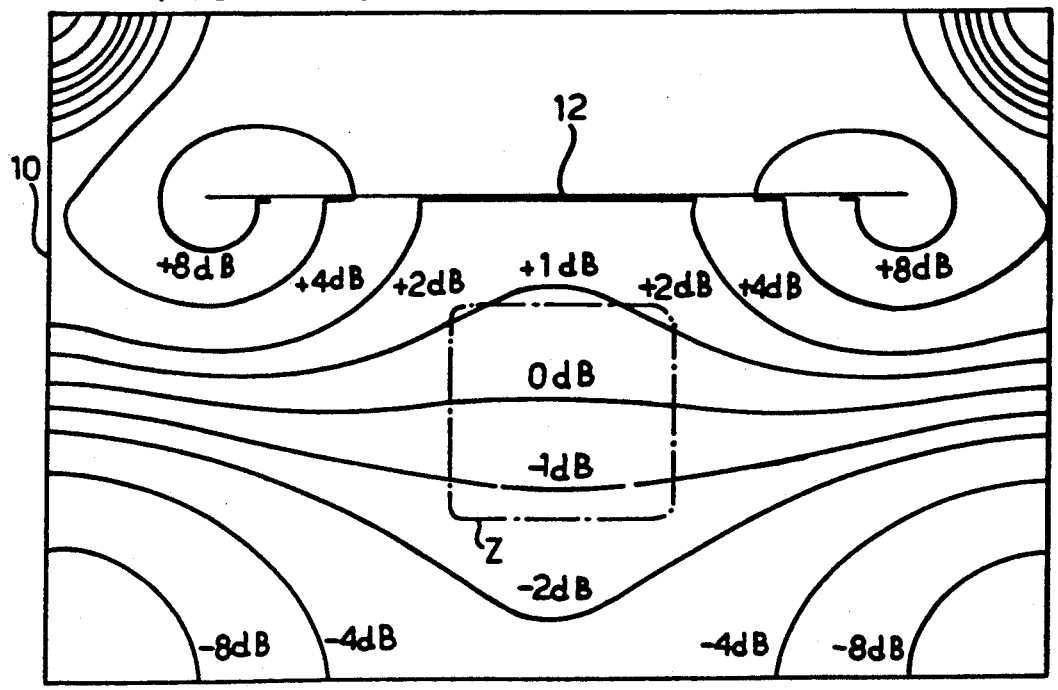
FIG. 1 is a schematic cross-section of a device for measuring electromagnetic interference according to the prior art.

With reference to FIGS. 3 to 6, a measurement device includes a closed test cell the periphery of which is defined by a tubular casing, generally indicated 10. The casing 10 constitutes the outer conductor of a TEM waveguide and has rectangular cross-sections throughout its length.

The casing 10 is defined at one end by a supply cusp 16 which is connected in turn to a supply 18 of known type for generating pulsed and/or sinusoidal power signals of variable frequency.

The casing 10 comprises a first portion 20 shaped like an asymmetrical pyramid and extending from the cusp 16.

As will become clearer from the following, the asymmetrical shape of the pyramid portion 20 enables the inner conductor 12, of which more will be said below, to be be positioned so as to leave a large space for the object under test, without greatly compromising the coaxial arrangement of the waveguide.

Next to the pyramid portion 20 is a portion 22 of the casing which has a uniform rectangular cross-section and defines a test region, indicated 24.

The peripheral walls of the prismatic portion 22 defining the test region 24 are indicated 26, 28 and 30, respectively. 26 is a base wall, 28 are side walls adjacent the base wall 26, and 30 is a top wall opposite the base wall 26.

The end of the test region 24 nearest the cusp is defined longitudinally by a flat, transverse partition 32 of a material with a low dielectric constant such as, for example, wood. The test region 24 is defined at its opposite end by an absorbent wall 34 of which more will be said below.

Figure 4:
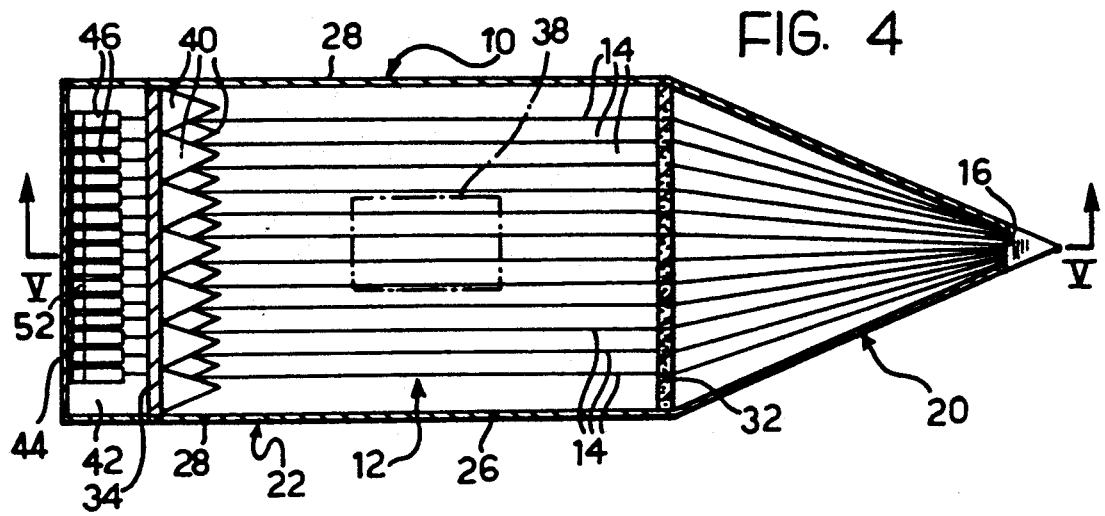
FIG. 4 is a horizontal, longitudinal section thereof taken in the plane IV—IV of FIG. 3.
Figure 5:
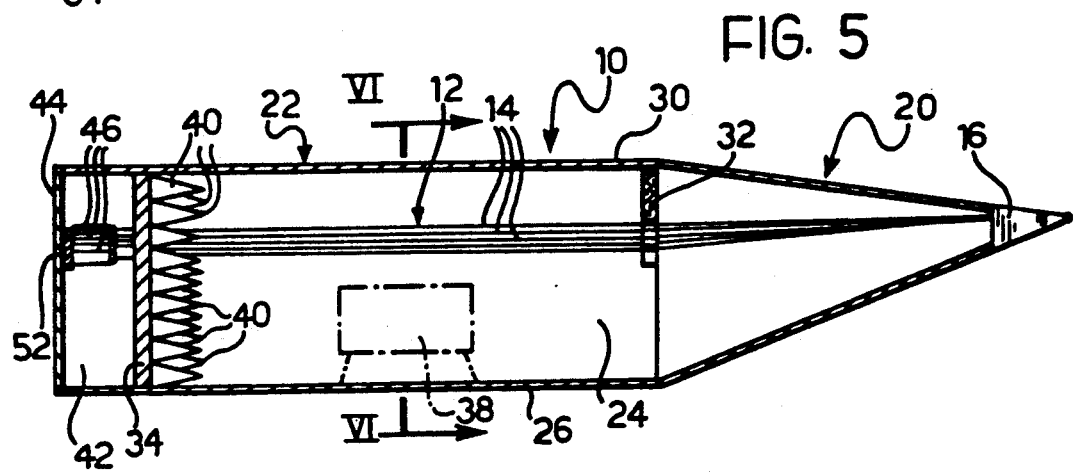
FIG. 5 is a vertical, longitudinal section thereof taken in the plane V—V of FIG. 4.
Figure 6:
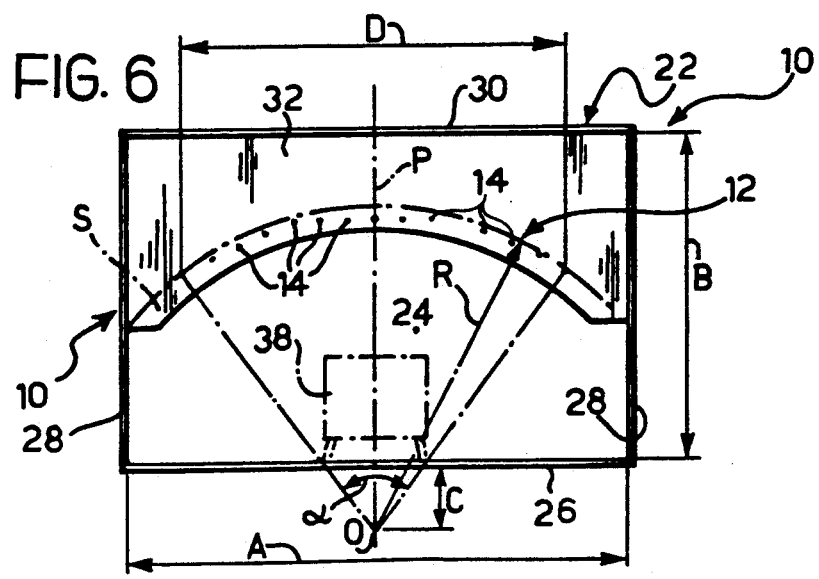
FIG. 6 is a cross-section thereof taken in the plane indicated VI—VI of FIG. 5, on an enlarged scale, and showing various dimensions used to define some preferred dimensional ratios.

One of the side walls 28 has a door 36 for access to the test region 24 which, amongst other things, enables the positioning and removal of the object under test, shown schematically at 38 in FIGS. 4 to 6.

The absorbent wall 34 carries an array of anechoic elements 40 of known pyramidal type, made of an expanded plastics material filled with graphite or carbon black. The elements 40, which are on the side facing the test region 24, have the function of high-frequency absorption.

On the side of the wall 34 facing away from the anechoic elements 40 is a compartment 42 which is defined by an end wall 44 and in which a series of resistors 46 of known type is disposed for low-frequency power dissipation.

The inner conductor 12 of the TEM waveguide is in the cell.

Figure 2:
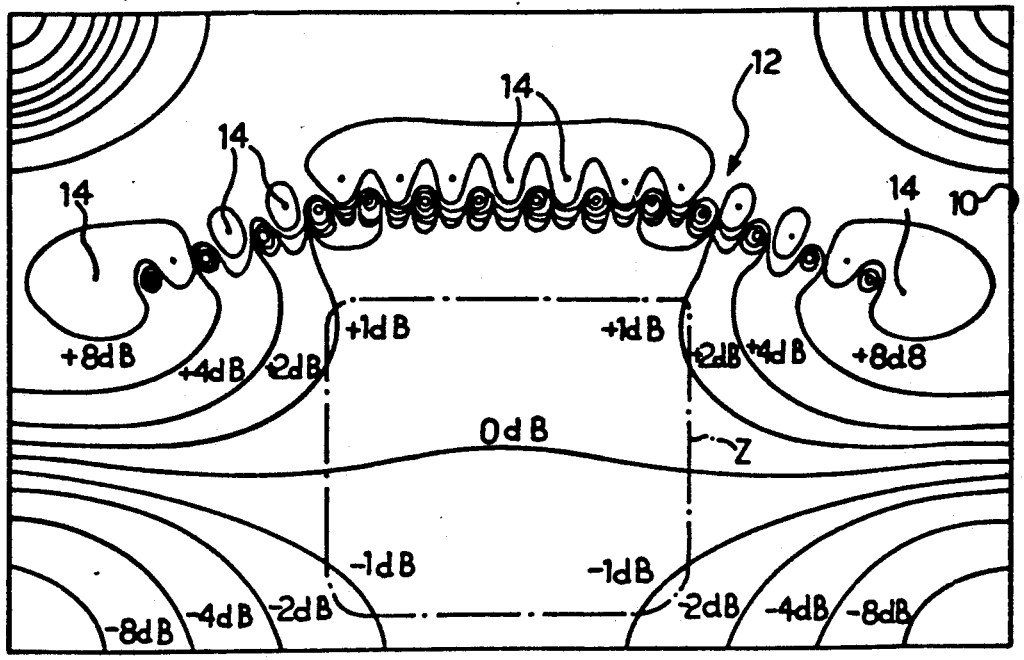
FIG. 2 is a schematic cross-section of a device for measuring electromagnetic interference according to the present invention.
Figure 3:
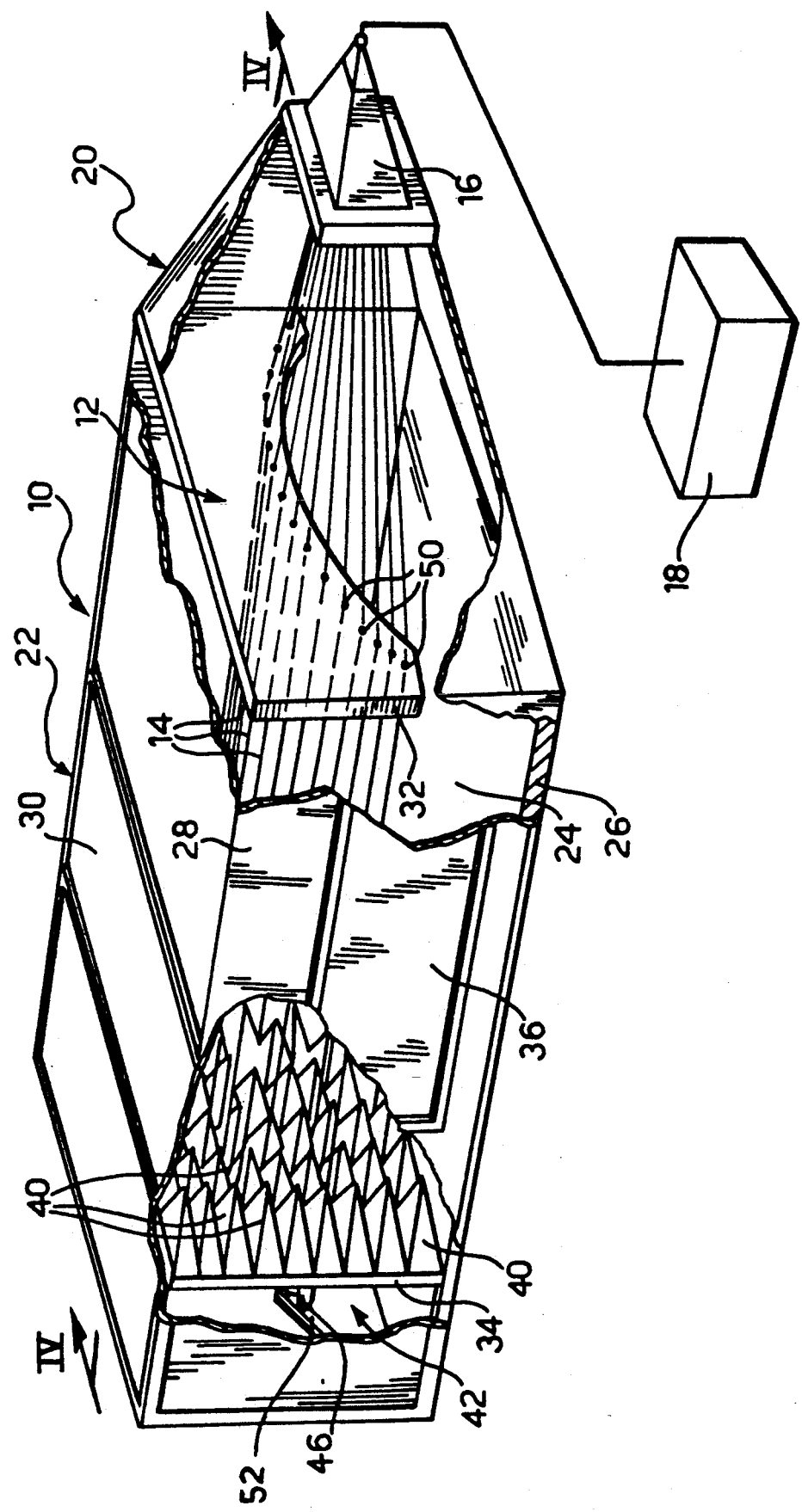
FIG. 3 is a schematic perspective view of a measurement device according to the invention.

As already stated in the introduction of the present description with reference to FIG. 2, the inner conductor is constituted by an array of wires 14 which extend from the cusp 16 to the resistors 46. In the embodiment shown, each wire 14 is connected to a respective resistor 46 but two or more wires 14 may be connected to a single common resistor. The wires extend through holes 50 in the partition 32 and corresponding holes (not shown) in the absorbent wall 34. Between the two walls 32 and 34, that is, in the test region 24, the wires 14 are taut and parallel with a substantially uniform transverse spacing.

The holes 50 in the partition 32 and the corresponding holes in the absorbent wall 34 are arranged substantially on an arc of a circle. In the test region 24, the array of wires 14 of the inner conductor has a corresponding, substantially arcuate transverse profile, the concave side of which faces the base wall 26 and the object 38 under test.

In FIG. 6, the arc on which the taut wires 14 are arranged in the test region 24 is indicated S. As can be seen in FIG. 6, the taut wires 14 are not actually arranged on the theoretical arc S but are displaced slightly therefrom, along a line broken into three portions and closely approximating to the arc S. Their arrangement along a broken line is convenient as regards the cost of the system for supporting the resistors 46, which are supported by three straight sections shown schematically at 52 and similarly arranged along a broken line.

Naturally, the holes 50 in the partition 32 and the corresponding holes in the wall 34 are arranged along corresponding broken lines.

With reference to FIG. 6, it has been found that the best arrangement for the inner conductor 12 constituted by the wires 14 or by a plate or strip is substantially an arc S which is centered relative to a median plane P perpendicular to the base wall 26 and whose centre of curvature O lies in the median plane outside the cell, that is, below the base wall 26 in the embodiment shown.

The arc S is subtended by a chord whose length D is less than the width A of the base wall 26.

In the rectangular cross-section of the portion 22 of uniform cross-section which corresponds to the test region 24, the height B of the sides corresponding to the peripheral walls 28 adjacent the base wall 26 is preferably substantially 2/3A. The radius R of the arc S is also substantially 2/3A. The distance C of the centre of curvature O of the arc S from the base wall 28 is substantially 1/5A. The arc S of the inner conductor 12 subtends an angle alpha of the order of 70°.

With this arrangement, it has been found that the best conditions are achieved with about fifteen wires 14.

With the proportions indicated above, an electromagnetic field diagram like that of FIG. 2 is obtained both when the inner conductor 12 is constituted by wires 14 and when the inner conductor is constituted by an arcuate plate. In the latter case, as already stated, the field diagram is even better.

I claim:

1. A device for measuring electromagnetic interference (EMI), of the type comprising a closed test cell the periphery of which is defined by an outer conductor of a waveguide constituted by a tubular casing having rectangular cross-sections and delimited at one end by a supply cusp and at the other end by a transverse wall which is absorbent as regards high frequencies and is associated with resistors for low-frequency dissipation, and an inner waveguide conductor extending within the cell between the supply cusp and the resistors, wherein the tubular casing has at least one intermediate portion of uniform rectangular cross-section including a test region for accommodating an object under test between the inner conductor and one of the peripheral walls of the outer conductor, called the base wall, and in that, at least in the intermediate portion, the inner conductor has a substantially arcuate transverse profile, the concave side of which faces the base wall.

2. A device as claimed in claim 1, wherein the inner conductor is constituted by an array of transversely spaced-apart parallel wires extending from the cusp to the resistors and, at least in the intermediate portion, arranged so that the array has the said arcuate transverse profile.

3. A device as claimed in claim 2, wherein the longitudinal ends of the test region are defined by a transverse partition of a material with a low dielectric constant, at the same end as the cusp, and by the absorbent wall, wherein the partition and the absorbent wall have holes for the passage of the wires of the inner conductor, the holes being disposed in a substantially arcuate arrangement corresponding to that of the wires.

4. A device as claimed in claim 1, wherein the substantially arcuate transverse profile of the inner conductor is substantially an arc which is centered relative to a longitudinal median plane perpendicular to the base wall and whose centre of curvature lies in the median plane.

5. A device as claimed in claim 4, wherein the centre of curvature of the arc is outside the tubular casing.

6. A device as claimed in claim 4, wherein the arc is subtended by a chord whose length is less than the width of the base wall.

7. A device as claimed in claim 5, wherein, in the rectangular cross-section of the portion of uniform cross-section, if A is the length of the side corresponding to the base wall, B is the length of the side corresponding to the peripheral walls adjacent the base wall, R is the radius of the arc of the inner conductor, and C is the distance of the centre of curvature of the arc from the base wall, the dimensional ratios are substantially as follows: $B=2/3A$, $R=2/3A$, $C=1/5A$.

8. A device as claimed in claim 7, wherein the arc of the inner conductor subtends an angle of the order of 70°.

* * * * *